United States Patent [19]

Sanders

[11] Patent Number: 4,746,595
[45] Date of Patent: May 24, 1988

[54] SUBBED SUPPORTS FOR IMAGING MATERIALS

[75] Inventor: James F. Sanders, St. Joseph, Wis.

[73] Assignee: Minnesota Mining and Manufacturing Company, St. Paul, Minn.

[21] Appl. No.: 854,840

[22] Filed: Apr. 22, 1986

[51] Int. Cl.$^4$ .......................... G03C 1/76; G03C 1/68
[52] U.S. Cl. .................................... 430/271; 430/293; 430/276; 430/531; 428/423.7
[58] Field of Search ............... 430/271, 293, 276, 531; 428/423.7

[56] References Cited

U.S. PATENT DOCUMENTS

| 3,027,343 | 3/1962 | Kane | 428/423.7 |
| 3,187,065 | 6/1965 | McPherson et al. | 430/531 X |
| 4,049,746 | 9/1977 | Muzyczko et al. | 430/271 X |
| 4,366,223 | 12/1982 | Larson | 430/293 X |
| 4,585,666 | 4/1986 | Lambert | 428/423.7 X |

Primary Examiner—Paul R. Michl
Assistant Examiner—Cynthia Hamilton
Attorney, Agent, or Firm—Donald M. Sell; James A. Smith; Mark A. Litman

[57] ABSTRACT

Subbing layers on carrier elements for use with photopolymerizable, photosolubilizable, and photodepolymerizable compositions are advantageously comprised of polyureas and polybiuret polymer.

10 Claims, No Drawings

SUBBED SUPPORTS FOR IMAGING MATERIALS

BACKGROUND OF THE INVENTION

1. Field of the Invention

This invention relates to imaging materials, particularly imaging materials which use negative acting photopolymerizable compositions, and more particularly to subbing layers useful on bases which are associated with photopolymerizable compositions.

2. Background of the Art

Photopolymerizable compositions can be used in a number of different types of imaging processes. One important commercial use of photopolymerizable compositions is in the technical area of color proofing, particularly in overlay color proofing. This type of process involves the formation of individual color sheets (e.g., cyan, magenta, yellow and black) from their respective color separation negatives and then overlaying the sheets in register to give a proof of the intended printed image. This type of procedure is disclosed for example in U.S. Pat. Nos. 3,136,637 and 3,671,236. The individual color layers can be formed by pigmented photopolymerizable compositions which, after exposure, are washed in developer solutions with mild scrubbing to provide the individual color images.

In addition to the overlay process, transfer processes can be used in the formation of proofing images. In this process, the individual color images are formed on carrier sheets and transferred, one at a time, onto a surface of a receptor sheet. The individual color images are transferred in register to form a prepress proof of the intended printed image. This type of process is shown in U.S. Pat. No. 4,482,625.

One particular area of problems that has been encountered in photopolymerizable (and photosolubilizable) compositions for use in prepress color proofing has been the critical balance in properties necessary between the substrate and the photopolymerizable composition. The composition must adhere reasonably well to the substrate before imaging, yet be removable in unexposed areas upon development. The exposed areas must also adhere well to the substrate and must adhere more strongly than the unexposed areas. The polymerized areas must also be capable of thermoplastic bonding or adhesive bonding to a receptor sheet with a bond strength greater than its bond strength to the carrier substrate. Without these balances in properties, there would be no faithful reproduction of images and the products would be readily subject to mechanical damage in even the mildly vigorous development processing which color proofing sheets undergo. A major improvement in this area was made by the introduction of polyamide subbing layers between the substrate and the photosensitive layer as shown in U.S. Pat. No. 3,778,272. There the use of methylolated or etherified polyamides soluble in a mixture of alcohol and water is described.

In order to provide higher photographic speed to photopolymeric compositions, it is generally necessary to use higher proportions of monomers and binders with large numbers of photopolymerizable groups thereon. Such binders and compositions using them are shown, for example, in U.S. Pat. Nos. 4,304,923 and 4,228,232. The compositions of these patents having higher monomeric and oligomeric components with lower proportions of film-forming binders provide the higher speed compositions. However, higher concentrations of monomers creates another problem, migration of components from the photosensitive layer into the substrate and/or subbing layer. The migration of the monomers usually carries dyes, photoinitiators and other additives with it. This can greatly vary the adherence properties of the photosensitive layer to the substrate, both before and after exposure. The speed of the photosensitive layer can also adversely vary with time because of the change in the composition of the photosensitive layer due to the uneven migration of components. Even the use of polyamide subbing layers on these types of higher speed photopolymerizable compositions (as shown in U.S. Pat. No. 4,482,625, Example 4) does not solve this migration problem.

SUMMARY OF THE INVENTION

The use of a substantially aliphatic film-forming polymer comprising a polyurea or polybiuret, generally formed as the reaction product of an amine and a diisocyanate, has been found to provide a good substrate for photosensitive imaging layers. In particular, this film-forming polymer provides good adherence to photopolymerizable compositions, good adherence to polymerized photopolymerizable layers, consistent removal of unexposed photopolymerizable compositions in development solutions and yet provides an easy and clean release for the polymerized composition to a receptor layer when needed.

DETAILED DESCRIPTION OF THE INVENTION

The present invention relates to photosensitive imaging layers on subbed support layers. The photosensitive compositions are preferably photohardenable compositions and photopolymerizable compositions, although photodepolymerizable compositions and photosolubilizable compositions may also be used. The photopolymerization of the composition should enable differential swellability, dispersability, or solubility in developer solutions between the exposed and unexposed areas. The developer solutions could be water, aqueous, aqueous alkaline, aqueous/organic, or organic. Various polymerizable functions could be used in the photopolymerizable layer such as acryloyl, methacryloyl, epoxy, vinyl, vinyl ether, silane, etc., although acryloyl and methacryloyl functionality is preferred. Preferably the photopolymerizable composition comprises at least 20 percent by weight of monomeric components (i.e., polymerizable compounds having at least two polymerizable moieties) and molecular weights below 1500. These preferred photopolymerizable compositions also comprise less than 50% by weight of inert (non-polymerizable) film-forming binder and 0 to 65% by weight of photopolymerizable oligomers.

The subbing layer of the present invention is generally described as a polyurea or polybiuret, the reaction products of a polyamine and a polyisocyanate. This reaction product tends to be a polyurea. Other chemical reactions occur also, so that the polymerization product need not only be a polyurea. After the reaction of one isocyanate group with a hydrogen of a primary amine, another active hydrogen remains on the reacted amine group. This second hydrogen can, and sometimes will, react with additional isocyanate groups to form a biuret group. This can favorably add to the crosslink density of the subbing layer. In fact, useful subbing layers according to the present invention can be formed from primary aliphatic monoamines and polyisocyanates in forming a polybiuret layer. Generally, however, it is preferred to have both urea and biuret linkages in the polymer of the subbing layer. At least twenty or thirty molar percent of the bridging group in the polymer should be selected from the group consisting of biuret and urea bridging groups. As later noted, other reactions can take place during polymerization such as polysiloxane linking and polyurethane linking. But it is essential to the present invention that some biuret and urea linkages be formed.

Polyureas may be formed by other reaction mechanisms. For example, a polyurea may be synthesized by the addition of polyisocyanate and water. This forms an adduct between the water and isocyanate which can then undergo decarboxylation to form an amine. This amine can then react with additional isocyanate to form the polyurea.

The preferred subbing layer of the present invention comprises a film-forming polymer which is the reaction product of a polyisocyanate (at least diisocyanate) and a polyamine (at least a diamine) wherein the polymer is substantially aliphatic. As used in the practice of the present invention, the term "substantially aliphatic" means that on a molar basis for all bridging groups in the diisocyanates and the diamines, fewer than twenty-five molar percent of those bridging units are aromatic or contain aromatic moieties. Preferably fewer than 20 molar percent, more preferably fewer than 10%, and most preferably fewer than 5% (down to 0%) of such bridging units contain aromatic groups. Preferred amines have the general formula $$A_a R(A_b^1 R^1)_c-Y$$

A and $A^1$ independently represent primary or secondary amines,
R is an aliphatic group
$R^1$ is an aliphatic group
a is the number of A groups attached to R and is equal to 0, 1 or 2 (preferably 0 or 1)
b is the number of $A^1$ groups attached to each $R^1$ group and is zero or a whole integer,
c is the number of $A^1 R^1$ groups in the compound,
Y is any terminating or functional group, and the sum of a plus bc is at least 2.

By a terminating group it is meant a group without significant reactive or functional properties such as H, lower aliphatic group such as alkyl ($C_1$-$C_{40}$) By functional group is meant a group which can provide particularly desired reactive or functional properties to the final polymer. An example would be $—Si(OCH_3)_3$ (a silane), an oxirane group, an amine group, etc. The sum of a and b is preferably at least three, a preferred range is 2 to 12, more preferred is 3 to 10, and most preferred is 3 to 6.

The preferred polyisocyanates have the formula $$OCN(CH_2)_m D(CH_2)_n NCO$$

wherein n and m are independently 0 or integers, (e.g., 1, 2, 3, 10, 40, 60, etc.), and D is a bridging group, including but not limited to carbon-to-carbon bonds, methine, polymethine (e.g., $(CH_2)_n$), cyclopentyl, cyclohexyl, aliphatic (including branched), etc. The bridging group D may also bear isocyanate groups so that polyisocyanates of 2–6 isocyanate groups are contemplated within the scope of the present invention. Preferably aliphatic diisocyanates having 6 to 50 carbon atoms between the isocyanate groups are used. More preferably diisocyanates having 10 to 40 carbon atoms between the isocyanate groups are used.

The subbing layer may contain additional ingredients and other reaction products besides the product of the polyamine and the polyisocyanate. For example, additional proportions of binders such as ethylcellulose (to provide good slip coatings) will react with the diisocyanate. Fumed silica may also be added to control the slip properties of the film. The use of silane terminated amines will even react with silica particles to further bind the system together.

Preferred photopolymerizable compositions useful with the subbing layers of the present invention may be described as follows.

The compositions comprise 10–60% by weight of polyfunctional monomers, 10–60% by weight of polyfunctional polymers or oligomers, 0–60% or 10–60% by weight of a polymer which is not polymerizable in the polymerization process of the monomers and oligomers, and 0.1 to 20% by weight of a photoinitiator system (photoinitiator plus senitizing dyes). Additionally, the coatings may contain from 2 to 50% by weight of colored dyes or pigments (e.g., cyan, magenta, yellow or black) to provide a color proofing image.

Monomers

The monomeric component of the present invention comprises a free radical polymerizable compound having at least two ethylenically unsaturated groups, and preferably at least 2 to 4 ethylenically unsaturated groups selected from the groups consisting of acrylate, methylacrylate, vinyl and allyl. Preferred are compounds having multiple acrylate and methacrylate groups, e.g., acrylic esters of low molecular weight polyols, such as trimethylolpropanetriacrylate, pentaerythritol tetraacrylate and triacrylate, etc. Preferably these monomers have a molecular weight of less than 2,000 and more preferably less than 1,000.

Suitable free radical polymerizable monomers useful in the compositions of the invention are well known and listed in many patents, e.g., U.S. Pat. Nos. 3,895,949 and 4,037,021. Preferred monomers are the polyacrylate and polymethacrylate esters of alkanepolyols, e.g., pentaerythritol tetraacrylate, tris(2-acryloxyethyl)isocyanurate, tris(2-methyacryloxyethyl)isocyanurate, 2-acetoxyethyl methacrylate, tetrahydrofurfurylmethacrylate, 1-aza-5-acryloxymethyl-3, 7-dioxabicyclo [3.0.0] octane (ADOZ) bis[4-(2-acryloxyethylphenyl]dimethyl methane, diacetone acrylamide, and acrylamidoethyl methacrylate.

Initiator

The compositions of the present invention must also have a radiation sensitive system capable of initiating free radical polymerization upon absorption of radiation. Free radical initiators are materials known in the art, such as *Free-Radical Chemistry*, D. C. Nonhebel and J. C. Walton, University Press (1974). Particularly suitable free radical generators can be selected from many classes of organic compounds including, for example, organic peroxides, azo compounds, aromatic diazonium salts, aromatic iodonium salts, aromatic sulfonium salts, aromatic phosphonium salts, quinones, benzophenones, nitroso compounds, acyl halides, aryl halides, hydrazones, mercapto compounds, pyrylium compounds, triarylimidazoles, biimidazoles, chloroalkyltriazines, etc. These materials, in general, must have photosensitizers therewith to form a photoinitiator system. Photosensitizers are well known in the art.

Additional reference in the art to free radical photoinitiator systems for ethylenically unsaturated compounds are included in U.S. Pat. Nos. 3,887,450 (e.g., column 4), 3,895,949 (e.g., column 7), and 4,043,819. Preferred initiators are the onium salts as disclosed in U.S. Pat. Nos. 3,729,313; 4,058,400; and 4,058,401. Other desirable initiators are biimidazoles (disclosed in U.S. patent application Ser. No. 824,733, filed Aug. 15, 1977) and chloroalkyltriazines as disclosed in U.S. Pat. No. 3,775,113. These references also disclose sensitizers therein. Another good reference to photoinitiator system is Light-Sensitive Systems, J. Kosar, 1965, J. Wiley and Sons, Inc., especially Chapter 5.

Oligomers and Polymers

A reactive polymer is defined in the practice of the present invention as any polymeric material having at least two polymerizable groups thereon and having a molecular weight greater than that of the monomer component. Preferably the molecular weight of the reactive polymer is sufficiently high that it is a film forming polymer by itself. This is generally indicated by a molecular weight of at least 2,000. It is also desirable that the reactive polymer swell in aqueous alkaline developer having a pH of 7.5 or greater. Combinations of reactive polymers are particularly desirable in tailoring the properties of the photosensitive layer. Swellability of one component emphasizes ease of developability in aqueous alkaline solution. Non-swellability of another reactive polymer component will contribute to the cohesiveness of the photosensitive layer during development. By balancing the proportions of swellable and non-swellable reactive polymer, one can provide whatever balance of ease of developability and cohesive strength that is necessary for particular product needs.

The oligomeric or polymeric component of the present invention comprises a free radical polymerizable oligomer having an ethylenically unsaturated group equivalent weight of between 45 and 5000 and being of a higher molecular weight than said monomer. Preferred oligomers are shown in U.S. Pat. No. 4,304,923 as urethane oligomers.

A generic structural formula for the urethane oligomers can be drawn as follows:

$$(E-D)_{\overline{a}}R(OCA)_b$$

wherein

E is an ethylenically unsaturated, free radical polymerizable group, preferably selected from acryloyloxyalkoxy (alternatively named acryloxyalkoxy), methacryloylalkoxy (alternatively named methacryloxyalkoxy), vinylalkoxy, and allyloxy, D is the residue of a polyisocyanate (preferably a diisocyanate) having at least two of its —N=C=O groups reacted to form

 groups

D bonding E to R,

A is a carboxylic acid containing group (e.g.,

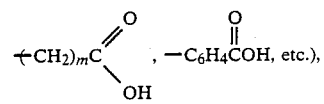

a is a number having an average value between 2 and 20, b is a number having an average value between 0.3 and 10, and m=1 to 6, R is the residue of a polyol having at least a+b hydroxyl groups and a number of average molecular weight between 90 and 10,000, the residue formed by removal of hydrogen from the hydroxyl groups.

The backbone of the oligomer, group R, may be any aromatic or aliphatic polyol having a molecular weight between 90 and 10,000. The backbone of the oligomer may be any oligomer with the requisite molecular weight and number of hydroxyl groups, but polyesterpolyols and polyoxyalkylene polyols are preferred. Linear oligomeric polyols are useful but the branched or three-dimensional polyols such as polycaprolactone polyols are preferred. The backbone may be prepared by any of the many well known methods of forming polyhydroxyl substituted oligomers having a molecular weight between 90 and 10,000. The polyols must have a hydroxy equivalent weight of between 45 and 5,000 to be useful according to the present invention. Preferably the polyol has a hydroxy equivalent weight between 90 and 4,000 and most preferably between 200 and 2,000.

The oligomers backbone may be homopolymeric, copolymeric, graft polymeric, or mixtures thereof. For example, polycaprolactone polyols may be used, or lower molecular weight polycaprolactone polyols (average molecular weights of less than, for example, 500) may be joined by polyacids (preferably dicarboxylic acids) or by polyisocyanates (preferably diisocyanates) to form higher molecular weight oligomer backbones.

Other useful reactive polymers include the reaction of a styrene-maleic anhydride copolymer and hydroxyethylmethacrylate. That reaction is effected by simply heating the two materials in a non-reactive solvent. An example of a particularly useful class of non-swellable reactive binders is acrylate functional cellulose esters. A preferred example of that class is the reaction product of cellulose acetate proprionate and isocyanatoethylmethacrylate.

Binders

The binder component of the present invention comprises an organic, polymeric thermoplastic binder having a molecular weight of at least 1,000 which is preferably not reactive with the polymerization mechanism of the monomer or oligomer. To be non-reactive with the oligomer and monomer, the binder must be able to pass the following test: 5 grams of the candidate binder, 3 grams of pentaerythritol tetraacrylate, 0.4 grams of diphenyliodonium hexafluoroantimonate and 0.4 grams of 4,4'-bis(dimethylamino) benzophenone sensitizing dye are dissolved in organic solvents (e.g., methylethylketone, isopropanol, ethylacetate, n-propanol/water azotrope, and mixtures thereof), and then irradiated for 15 seconds to a carbon arc having a 5,000 watt output at a distance of about 1 meter. If at least 90% by weight of the binder can be separated from the polymerized acrylate by leaching or other differential solvent techniques, the binder is non-reactive according to the teachings of the present invention.

The binders preferably should be heat-softenable between 100 and 400° F. (38° C. to 205° C.). It is also particularly useful to the present invention that the binder not be soluble in at least one solution selected from the class consisting of aqueous alkaline solutions at a pH of 9.0 (e.g., water and NaOH), aqueous alcohol solutions (e.g., water and n-propanol, 80/20 blend), and organic solutions (e.g., toluene/ethyl acetate, 50/50 blend). The inability of the binder to be solubilized by at least one of these solutions assists in preserving desired properties during the development process. If the binder is not solubilizing and leached from the polymerized areas, its desirable thermoplastic properties will be preserved in the polymerized image areas, enable subsequent transfer. The most preferred binders in the practice of the present invention are polyketones. Lower molecular weight methacrylates and polyesters are also useful.

The substrates useful with the subbing layers of the present invention include polymeric resins (e.g., polyesters such as polyethyleneterephthalate, cellulose esters such as cellulose triacetate and cellulose acetate proprionate, poly(vinyl acetals) such as poly(vinyl formal), poly(vinyl chloride), poly(vinylidene chloride), polyolefins, etc.), paper (both cellulose fiber and polymeric fiber paper), metallized polymers, polymer coated metals, glass, pigmented paper (i.e., coated printing stock), ceramic, etc. It is preferred in the practice of the present invention to use polymeric film substrates, particularly transparent polymeric film substrates, and most preferably polyester substrates. Additional layers such as antihalation layers may be associated with the substrate as needed or desired.

Other additional ingredients may be present in the subbing layer such as coating aids, surfactants, high molecular weight binders, lubricants, matting agents, antihalation dyes, etc. These and other aspects of the present invention will be further understood from the following non-limiting examples.

EXAMPLE 1

The following coating composition was made by first dissolving the binder (ethyl cellulose) and then adding the remaining ingredients in the order shown below:

| | |
|---|---|
| ethyl cellulose (N22, Hercules) | 40 g |
| 1,1,2-trichloroethane | 18 kg |
| dodecyldiisocyanate (DDI 1410, Henkel) | 180 g |
| polyamine-silane (A 1130, Union Carbide)* | 20 g |
| dibutyltin dilaurate | 10 g |

This solution was coated onto unprimed 2 mil ($5.08 \times 10^{-2}$ mm) polyethyleneterephthalate film to provide a dry coating weight of 150 mg/m². This dried subbing layer was overcoated with a coating solution comprising:

| | |
|---|---|
| pentaerythritol tetraacrylate | 50 g |
| oligomer (Preparation II of U.S. Pat. No. 4,228,232) | 40 g |
| carbon black | 30 g |
| diphenyl iodonium hexafluorophosphate | 12 g |
| sensitizing dye (p-dimethylammobenzylacetone) | 3 g |

| -continued | |
|---|---|
| trichloroethane | 1600 g |

The dried photosensitive element was contact imaged through a photographic negative and developed in an aqueous alkaline solution containing 1.5% by weight sodium hydroxide and 0.2% of a nonol phenol ethylene oxide adduct, a non-ionic surfactant wetting agent (marketed as X-100 by Rohm and Haas) and then air dried. The image developed with good resolution and, after drying, transferred to a resin coated paper receptor sheet in a hot two roll laminator. The peel force required to remove the laminated film from the paper was very low. The subbing layer remained with the polyester film.

A comparison of the film of this invention was made by using a subbing layer coating solution of

| | |
|---|---|
| Elvamide 8063 (alcohol soluble polyamide described in U.K. 1,441,982 and U.S. 4,482,625 | 50 g |
| Methaol | 1000 g |
| Trichloroethane | 1000 g |

Coatings were made at coating weights varying from 10 mg to 300 mg/m², coated with the photosensitive composition of this Example 1, then exposed and developed as in this Example.

The lower coating weights (less than 50 mg/m²) of the Elvamide provided good bonding of the photopolymer image, but failed to provide release in the thermal transfer step. Higher coating weights caused substantial loss of the photopolymer photographic speed due to the swelling of the polyamide by the monomer.

Comparisons with coatings of polyacrylates, cellulose polymers, vinyl acetates, polyvinyl alcohol, polyvinyl butyral, chlorinated polymers, polyvinyl ethers (and copolymers thereof), fluoropolymers, polysiloxanes, gelatin, polyethylene (and copolymers), polyurethanes (polycarbonates), and unsaturated hydrocarbon polymers (e.g., polybutadiene) were made. Failure of each of these materials fall into two distinct types. In one group (polyamides, polyurethanes, polyesters, etc), thermal release was very poor. In the second group, the developer had difficulty in differentiating between exposed and unexposed areas so that photopolymerized images could be lifted from the support (subbing layer) by the developer action.

When 100% of the aliphatic diisocyanate used in Example 1 was replaced with an aromatic diisocyanate

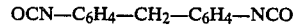

$$OCN-C_6H_4-CH_2-C_6H_4-NCO$$

and the remainder of the Example repeated, poor thermal release properties were obtained.

The same results occurred when the aliphatic amine of Example 1 was replaced with m-xylylenediamine, $C_6H_4(CH_2NH_2)_2$. Poor thermal release properties were obtained.

EXAMPLE 2

Example 1 was repeated except that the aliphatic amine-silane was replaced by triethylene tetraamine on an equivalent weight basis. Essential identical high quality results were obtained as found in Example 1. The silane moiety of Example 1 tends to have the effect of increasing solvent resistance during overcoating. That moiety is desirable, but not essential to the present invention.

EXAMPLE 3

Example 1 was repeated except that the dodecyl-diisocyanate was replaced with 80 grams of 1,6-diisocyanato hexane. Care was taken to keep the diisocyanate from evaporating before polymerization. The coating worked well as a subbing material for the polymerizable composition.

I claim:

1. A photosensitive proofing element comprising a transparent polymeric substrate having a subbing layer on at least one surface thereof comprising a substantially aliphatic polymer having urea and biuret linkages and adhered to said subbing layer a negative acting photopolymerizable composition comprising by weight:
   - 10-60% of a polyethylenically unsaturated acryloyl or methacryloyl monomer,
   - 10-60% of a polyethylenically unsaturated polymer having acryloyl or methacryloyl groups,
   - 10-60% of a polyketone resin binder,
   - 0.1-20% of a free radical photoinitiator and a spectral sensitizer for said photoinitiator, and
   - 2-50% of a colored pigment.

2. A photosensitive proofing element comprising a carrier for use with photopolymerizable compositions, said carrier comprising a substrate having on at least one surface thereof a continuous coating comprising the substantially aliphatic polymeric reaction product of a polyamine and a polyisocyanate, and on said at least one surface a photopolymerizable composition comprising by weight
   - 10-60% of a polyethylenically unsaturated monomer,
   - 10-60% of a polyethylenically unsaturated polymer or oligomer,
   - 10-60% of a polymeric binder,
   - 0.1-20% of a photoinitiator system, and
   - 0-50% of a dye or pigment.

3. The proofing element of claim 2 wherein said substrate comprises a polyethyleneterephthalate polymeric film and said photopolymerizable composition contains 2-50% of a dye or pigment.

4. The proofing element of claim 2 wherein said substrate comprises a polyethyleneterephthalate polymeric film and said polyisocyanate is represented by the formula $$OCN(CH_2)_mD(CH_2)_nNCO$$

wherein m and n are 0 or whole number integers and D is an aliphatic bridging group.

5. The proofing element of claim 2 wherein said polyamine is represented by the structural formula $$A_aR(A_b^1R^1)_c-Y$$

wherein
   A and $A^1$ independently represent primary or secondary amines,
   R is an aliphatic group,
   $R^1$ is an aliphatic group,
   a is the number of A groups attached to R and is equal to 0, 1 or 2,
   b is the number of $A^1$ groups attached to each $R^1$ group and is 0 or a whole integer,
   c is the number of $A^1R^1$ groups in the polyamine, and
   Y is any terminating or functional group and the sum of a plus bc is at least 2, and wherein said isocyanate is represented by the formula $$OCN(CH_2)_mD(CH_2)_nNCO$$

wherein m and n are 0 or whole number integers and D is an aliphatic bridging group and wherein said dye or pigment comprises from 2-50% of said photopolymerizable composition.

6. The proofing element of claim 1 wherein said polyamine is represented by the structural formula $$A_aR(A_b^1R^1)_c-Y$$

wherein
   A and $A^1$ independently represent primary or secondary amines,
   R is an aliphatic group,
   $R^1$ is an aliphatic group,
   a is the number of A groups attached to R and is equal to 0, 1 or 2,
   b is the number of $A^1$ groups attached to each $R^1$ group and is 0 or a whole integer,
   c is the number of $A^1R^1$ groups in the polyamine, and
   Y is any terminating or functional group and the sum of a plus bc is at least 2, and wherein said isocyanate is represented by the formula $$OCN(CH_2)_mD(CH_2)_nNCO$$

wherein m and n are 0 or whole numbe integers and D is an aliphatic bridging group and wherein all bridging groups between the amines of the polyamines and the isocyanates of the polyisocyanates are aliphatic.

7. A photosensitive proofing element comprising a carrier for use with photopolymerizable compositions, said carrier comprising a substrate having on at least one surface thereof a continuous coating comprising the substantially aliphatic polymeric reaction product of a polyamine and a polyisocyanate, and on said at least one surface photopolymerizable composition comprising by weight
   - 10-60% of a polyethylenically unsaturated monomer,
   - 10-60% of a polyethylenically unsaturated polymer or oligomer,
   - 0-60% of a polymeric binder,
   - 0.1-12% of a photoinitiator system, and
   - 0-50% of a dye or pigment.

8. A photosensitive proofing element comprising a carrier for use with photopolymerizable compositions, said carrier comprising a substrate having on at least one surface thereof a continuous coating comprising the substantially aliphatic polymeric reaction product of a polyamine and a polyisocyanate, and on said at least one surface a photopolymerizable composition comprising by weight
   - 10-60% of a polyethylenically unsaturated monomer,
   - 10-60% of a polyethylenically unsaturated polymer or oligomer,
   - 0-60% of a polymeric binder,
   - 0.1-20% of a photoinitiator system, and
   - 2-50% of a dye or pigment, and wherein said substrate is a polyethyleneterephthalate polymeric film.

9. The proofing element of claim 8 wherein said polyisocyanate is represented by the formula $$OCN(CH_2)_m D(CH_2)_n NCO$$

wherein m and n are 0 or whole numbers integers and D is an aliphatic bridging group.

10. The proofing element of claim 8 wherein the bridging group between the amines of the polyamines and between the isocyanates of the polyisocyanates are aliphatic.

* * * * *